United States Patent
Lin et al.

(10) Patent No.: US 12,310,158 B2
(45) Date of Patent: May 20, 2025

(54) OPTOELECTRONIC PACKAGE STRUCTURE

(71) Applicant: LITE-ON TECHNOLOGY CORPORATION, Taipei (TW)

(72) Inventors: Chen-Hsiu Lin, New Taipei (TW); Bo-Jhih Chen, New Taipei (TW); Chien-Shun Huang, Changhua County (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 476 days.

(21) Appl. No.: 17/742,479

(22) Filed: May 12, 2022

(65) Prior Publication Data

US 2022/0367773 A1 Nov. 17, 2022

Related U.S. Application Data

(60) Provisional application No. 63/188,475, filed on May 14, 2021.

(30) Foreign Application Priority Data

Nov. 25, 2021 (CN) .......................... 202111411880.8

(51) Int. Cl.
*H10H 20/857* (2025.01)
*H10H 20/85* (2025.01)
*H10H 20/853* (2025.01)

(52) U.S. Cl.
CPC ...... *H10H 20/857* (2025.01); *H10H 20/8506* (2025.01); *H10H 20/853* (2025.01)

(58) Field of Classification Search
CPC ....... H01L 33/62; H01L 33/486; H01L 33/54; H01L 31/0203; H01L 31/167; H01L 25/167; H01L 31/02005; H10H 20/857; H10H 20/8506; H10H 20/853; H10H 20/052; H10D 48/07; H10D 30/0295; A23B 11/12; A23B 2/40; H10F 77/331
See application file for complete search history.

(56) References Cited

U.S. PATENT DOCUMENTS

| | | | |
|---|---|---|---|
| 7,436,680 B2 * | 10/2008 | Wang ................ | H01L 27/14618 439/71 |
| 10,347,554 B2 * | 7/2019 | Santos .................... | H01L 33/60 |
| 2008/0191231 A1 * | 8/2008 | Park .................. | G02F 1/133603 257/E25.02 |
| 2008/0315239 A1 * | 12/2008 | Lin ..................... | H01L 23/3735 29/852 |
| 2011/0104855 A1 * | 5/2011 | Lin ......................... | H01L 24/29 438/118 |

(Continued)

*Primary Examiner* — Kevin Quarterman
(74) *Attorney, Agent, or Firm* — Li & Cai Intellectual Property (USA) Office

(57) ABSTRACT

An optoelectronic package structure is provided. The optoelectronic package structure includes a carrier, a metal member, an insulating layer, an optoelectronic element, and an adhesive. The metal member is disposed on the carrier. The insulating layer is disposed on the metal member. The insulating layer has a plurality of grooves, and a carrying region is defined by the grooves. The optoelectronic element is disposed on the insulating layer. The adhesive is filled into the grooves and bonds the optoelectronic element onto the carrying region of the insulating layer.

19 Claims, 14 Drawing Sheets

(56) References Cited

U.S. PATENT DOCUMENTS

2020/0350207 A1\* 11/2020 Schwarz ............. H01L 21/7806
2021/0410294 A1\* 12/2021 Li ........................ H05K 3/3452
2022/0071000 A1\* 3/2022 Tseng .................. H05K 3/4069

\* cited by examiner

OPTOELECTRONIC PACKAGE STRUCTURE

CROSS-REFERENCE TO RELATED PATENT APPLICATION

This application claims priority to the U.S. Provisional Patent Application Ser. No. 63/188,475 filed on May 14, 2021, and to China Patent Application No. 202111411880.8 filed on Nov. 25, 2021 in People's Republic of China. The entire content of each of the above identified applications is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an optoelectronic package structure, and more particularly to an optoelectronic package structure that accommodates a large-sized optoelectronic diode.

BACKGROUND OF THE DISCLOSURE

Currently, a wearable device can be used to examine vital signs, such as heartbeat values, oxygen saturation, and blood pressure values. In the wearable device, a light-emitting diode (LED) capable of emitting light of different wavelengths is mainly configured to cooperate with an optoelectronic diode. The optoelectronic diode can receive and convert light emitted from the LED into electric current or voltage signals. Hence, if a size of the optoelectronic diode can be increased so as to enlarge an area of a light-receiving surface of the optoelectronic diode, a photoelectric current outputted by the optoelectronic diode can be increased, and a higher detection accuracy can be afforded.

Therefore, how to improve an optoelectronic package structure, so as to allow for accommodation of an optoelectronic diode with a larger size, has become one of the important issues to be solved in the field.

SUMMARY OF THE DISCLOSURE

In response to the above-referenced technical inadequacy, the present disclosure provides an optoelectronic package structure.

In one aspect, the present disclosure provides an optoelectronic package structure, which includes a carrier, a metal member, an insulating layer, an optoelectronic element, and an adhesive. The metal member is disposed on the carrier. The insulating layer is disposed on the metal member. The insulating layer has a plurality of grooves, and a carrying region is defined by the grooves. The optoelectronic element is disposed on the insulating layer. The adhesive is filled into the grooves and bonds the optoelectronic element onto the carrying region of the insulating layer.

Therefore, in the optoelectronic package structure provided by the present disclosure, by disposing the optoelectronic element on the carrying region which is defined by the grooves of the insulating layer without being limited by an area of a wire bonding region, the size of the optoelectronic element and an area of a light-receiving surface can be increased, such that a photoelectric current outputted by the optoelectronic element can be increased, and an improved detection accuracy can be provided.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
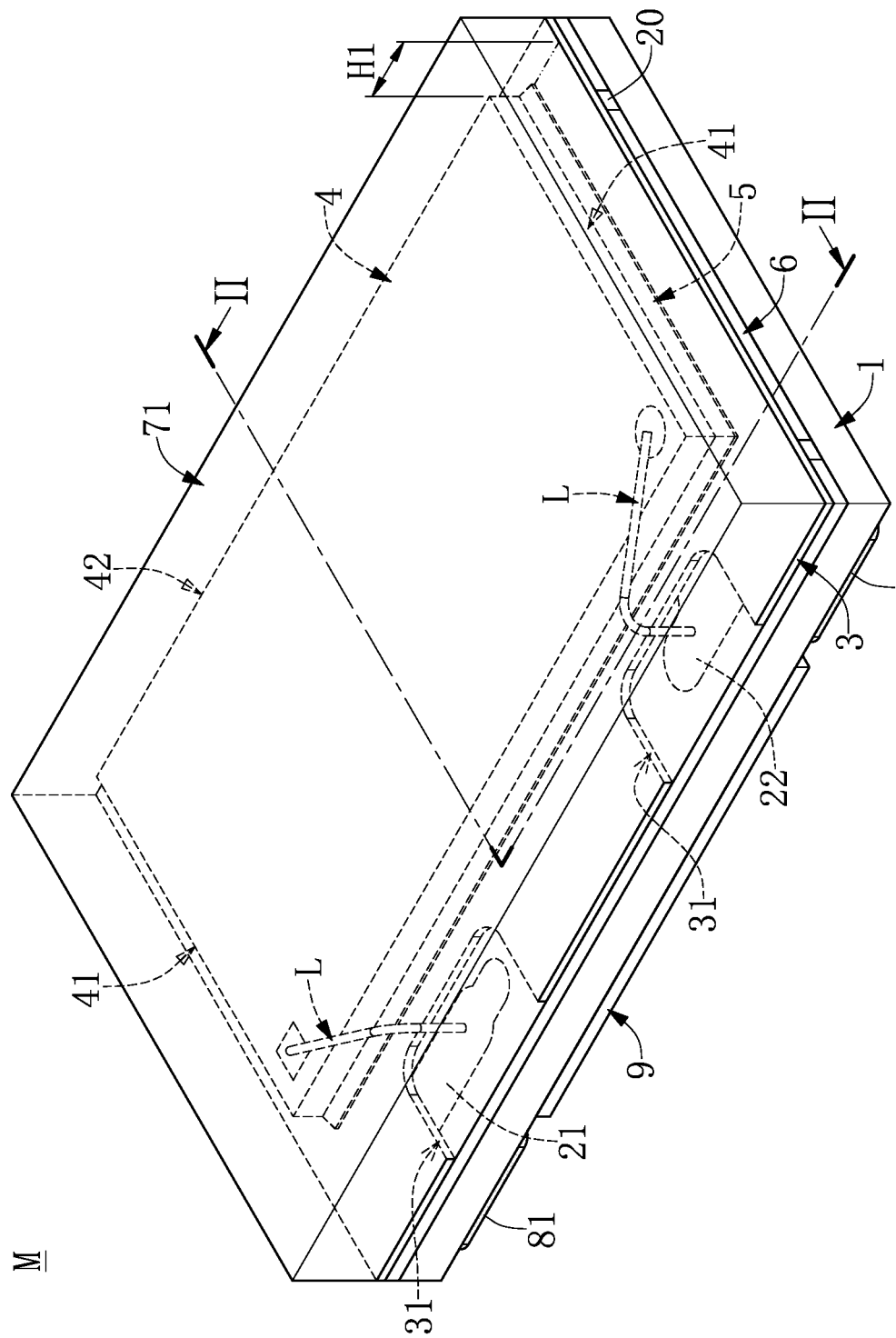
FIG. 1 is a schematic perspective view of an optoelectronic package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
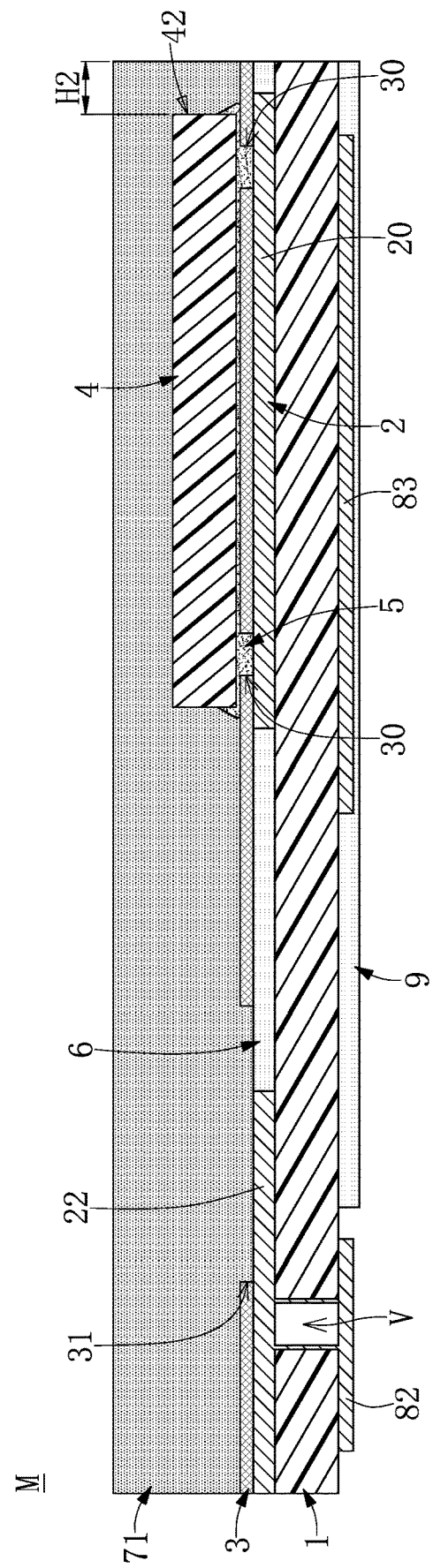
FIG. 2 is a schematic cross-sectional view of a cross-section taken along line II-II of FIG. 1.
Figure 3:
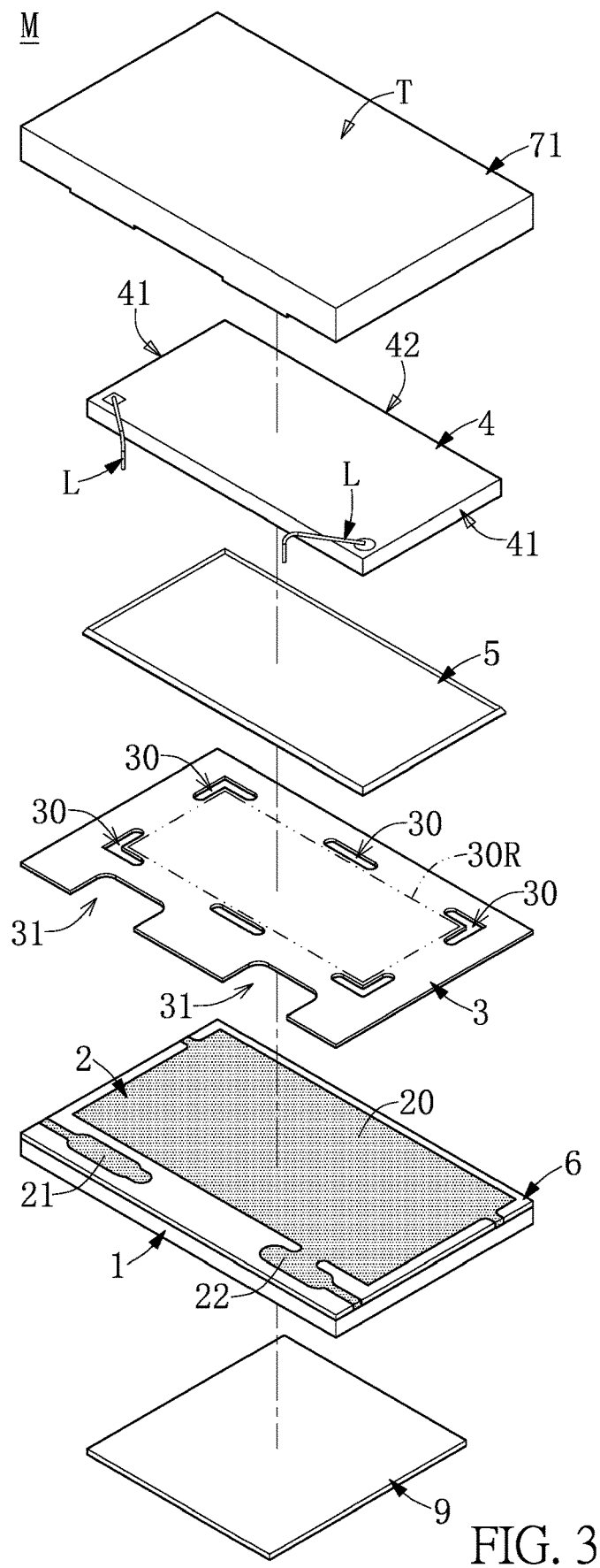
FIG. 3 is a schematic exploded view of the optoelectronic package structure according to the first embodiment of the present disclosure.

Reference is made to FIG. 1 to FIG. 3. A first embodiment of the present disclosure provides an optoelectronic package structure M, which includes a carrier 1, a metal member 2, an insulating layer 3, an optoelectronic element 4, and an adhesive 5. The metal member 2 is disposed on the carrier 1, and the insulating layer 3 is disposed on the metal member 2. From another perspective, the metal member 2 is formed on the carrier 1, and the insulating layer 3 covers the metal member 2. For example, the carrier 1 can be a black bismaleimide triazine (BT) substrate, the metal member 2 can be a copper foil, and the insulating layer 3 can be a solder mask. The solder mask is made from a solder mask ink of a dark color or a white color (a black color is taken as an example in the present disclosure). The insulating layer 3 has a plurality of grooves 30, and the grooves 30 are surroundingly arranged to define a carrying region 30R (as depicted by a frame outlined by broken lines in FIG. 3). The optoelectronic element 4 is an optoelectronic diode that is disposed on the insulating layer 3, and the adhesive 5 bonds the optoelectronic element 4 onto the carrying region 30R of the insulating layer 3. That is to say, the grooves 30 surround the optoelectronic element 4, and the adhesive 5 is located within a region surrounded by the grooves 30. The adhesive 5 is configured to fix the optoelectronic element 4 onto the insulating layer 3 (as shown in FIG. 2). When the optoelectronic element 4 is disposed on the carrying region 30R, the adhesive 5 overflows as a result of pressure from the optoelectronic element 4, and is filled into the grooves 30. In other words, the structure of the grooves 30 can reduce an overflowing effect of the adhesive 5. In addition, through the configuration of the grooves 30, the adhesive 5 can be filled into the grooves 30, so as to form a nail-shaped fixing structure. A shear strength of the optoelectronic element 4 being fixed onto the insulating layer 3 can thus be significantly enhanced. That is, a die shear stress that the optoelectronic element 4 can bear is greatly increased. In this way, an issue of poor adhesion force caused by a surface of the solder mask being too smooth for the optoelectronic element 4 to be fixed thereto in the conventional technology can be solved, thereby increasing a bonding force between the optoelectronic element 4 and a circuit substrate. It should be noted that the circuit substrate mentioned herein refers to a component formed by a combination of the carrier 1 and copper foils above and below (i.e., the metal member 2 and a conductor member 8 to be described below). However, the present disclosure is not limited thereto.

Furthermore, the metal member 2 includes a main portion 20, a first polarity portion 21, and a second polarity portion 22, and the main portion 20 is connected to the second polarity portion 22. As such, the first polarity portion 21, the second polarity portion 22, and the main portion 20 are arranged to have different polarities (a cathode or an anode). An orthogonal projection of the optoelectronic element 4 is on a top surface defined by the main portion 20 of the metal member 2. The main portion 20 is exposed from a bottom of the grooves 30 of the insulating layer 3. In addition, the top surface of the main portion 20 exposed from the bottom of the grooves 30 has a metal plated layer (not shown in the drawings), such as nickel gold.

Specifically, the insulating layer 3 further has two concave portions 31, and the two concave portions 31 respectively correspond to the first polarity portion 21 and the second polarity portion 22. When the insulating layer 3 is disposed on the metal member 2, the first polarity portion 21 and the second polarity portion 22 are respectively exposed from the two concave portions 31. Accordingly, the optoelectronic element 4 that is disposed on the insulating layer 3 can be correspondingly and electrically connected to the first polarity portion 21 and the second polarity portion 22 of the metal member 2 in a wire bonding manner.

In continuation of the above, the optoelectronic package structure M further includes a first solder mask 6 and a first encapsulant 71. The first solder mask 6 is disposed on the carrier 1, and a periphery of the metal member 2 is filled with the first solder mask 6. The first solder mask 6 can be made from a solder mask ink of a dark color or a white color. The first solder mask 6 can undergo a polishing process, so that a top surface of the first solder mask 6 is flush with a top surface of the metal member 2. In this way, a height difference between the top surface of the metal member 2 and the top surface of the first solder mask 6 is decreased, and a levelness of the optoelectronic element 4 and the insulating layer 3 that are stacked on the metal member 2 can be maintained (as shown in FIG. 2). More specifically, the main portion 20, the first polarity portion 21, and the second polarity portion 22 of the metal member 2 are all surrounded by the first solder mask 6, and top surfaces of the main portion 20, the first polarity portion 21, and the second polarity portion 22 are exposed from the first solder mask 6. Preferably, the top surface of the first solder mask 6 and those of the main portion 20, the first polarity portion 21, and the second polarity portion 22 are flush with each other and form a bonded surface. The first encapsulant 71 is disposed on the carrier 1. The first encapsulant 71 is a light-transmissive gel, and is configured to cover the optoelectronic element 4. The optoelectronic element 4 has a plurality of first sides 41 and a second side 42 neighboring the first sides 41. To be more specific, as shown in FIG. 3, the optoelectronic element 4 has the two first sides 41 that are opposite to each other and the second side 42 that is connected between the two first sides 41. A first distance H1 (as shown in FIG. 1) is defined between each of the first sides 41 and a corresponding edge of the carrier 1, and a second distance H2 (as shown in FIG. 2) is defined between the second side 42 and a corresponding edge of the carrier 1. In the present disclosure, the first distance H1 is 200 μm or less (preferably from 150 μm to 200 μm), and the second distance H2 is 200 μm or less (preferably from 75 μm to 125 μm). More specifically, a distance between any one of the two first sides 41 and a corresponding edge of the encapsulant 71 is 200 μm or less. A distance between the second side 42 and a corresponding edge of the encapsulant 71 is 200 μm or less, and is preferably 125 μm or less. Furthermore, a horizontal difference between the second side 42 of the optoelectronic element 4 and one neighboring side of the metal member 2 is preferably between 75 μm and 125 μm. It is worth mentioning that a ratio of a projection area of the carrying region 30R to that of the orthogonal projection of the optoelectronic element 4 onto the carrier 1 is from 0.7 to 0.9. Accordingly, in the optoelectronic package structure M of the present disclosure, an area percentage of the optoelectronic element 4 that is disposed on the carrier 1 can be maximized and a maximum package effect can be achieved, such that the optoelectronic package structure M can have an enhanced photoelectric current output and an improved detection accuracy. Moreover, as previously mentioned, the structure of the grooves 30 can reduce the overflowing effect of the adhesive 5. As shown in FIG. 2, since the overflowing adhesive 5 is filled into the grooves 30, a space between the second side 42 and the corresponding edge of the carrier 1 is not filled with the adhesive 5. Therefore, even when the optoelectronic element 4 is maximized (i.e., the space between the second side 42 and the corresponding edge of the carrier 1 is at its narrowest), the first encapsulant 71 can still cover a top portion and a peripheral surface of the optoelectronic element 4, so as to ensure a tight bonding.

Figure 4:
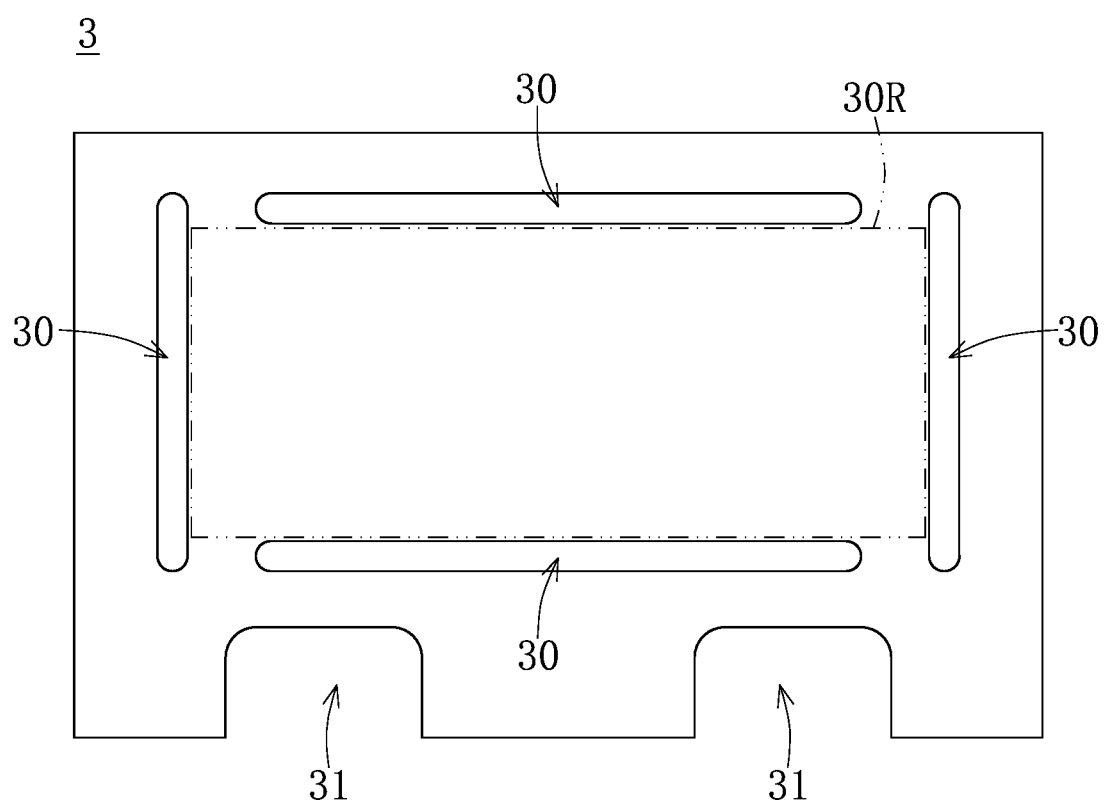
FIG. 4 is a schematic view showing another configuration of an insulating layer of the optoelectronic package structure according to the present disclosure.

Reference is further made to FIG. 3. In the present embodiment, a number of the grooves 30 are L-shaped, and other ones of the grooves 30 are shaped as a straight line. Specifically speaking, the L-shaped grooves 30 are arranged at four corners of the carrying region 30R, and the grooves 30 that are shaped as a straight line are in a staggered arrangement with the L-shaped grooves 30. In addition, in the present embodiment, the carrying region 30R is a rectangular region having a predetermined long side and a predetermined short side. A ratio is defined between a length of the long side of the carrying region 30R and a structural length of the groove 30 that is parallel to the long side of the carrying region 30R, which is 2:1. Another ratio is defined between a length of the short side of the carrying region 30R and a structural length of the groove 30 that is parallel to the short side of the carrying region 30R, which is 1:0.6. However, the shape of the grooves 30 is not limited in the present disclosure. For example, the grooves 30 can be shaped as a straight line or L-shaped only. As shown in FIG. 4, four of the grooves 30 that are shaped as a straight line are surroundingly arranged on the insulating layer 3 to define the carrying region 30R.

Figure 5:
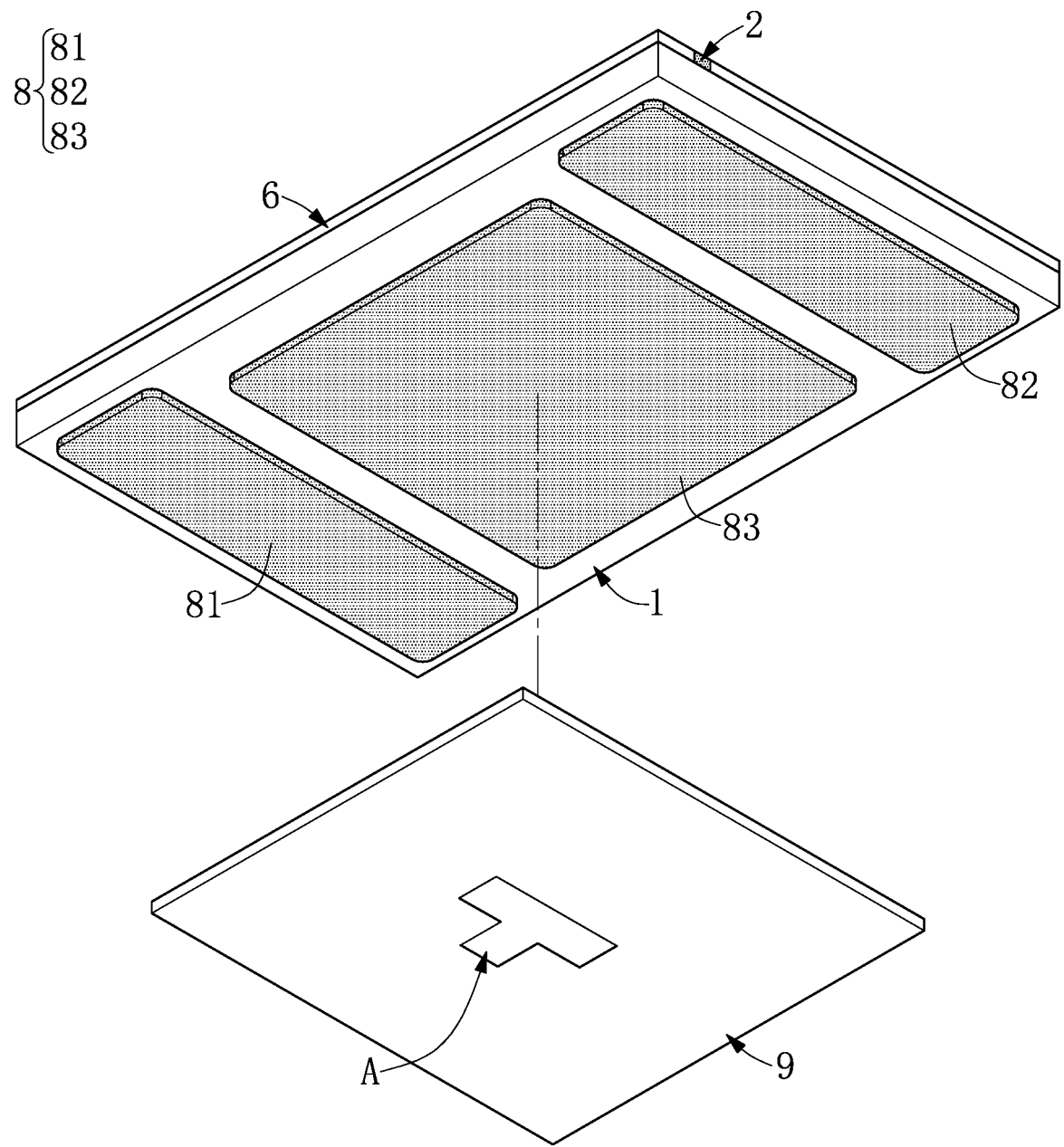
FIG. 5 is a schematic perspective view showing a bottom surface of a carrier of the optoelectronic package structure according to the first embodiment of the present disclosure.

Referring to FIG. 3 and FIG. 5, the metal member 2 and the conductor member 8 are disposed on a top surface and a lower surface of the carrier 1, respectively. The metal member 2 is mainly used as a die-bonding pad, and the conductor member 8 is mainly used as a wetting pad. The metal member 2 and the first solder mask 6 are disposed on a surface of the carrier 1, and the optoelectronic package structure M further includes another solder mask (which is hereafter referred to as a second solder mask 9, so as to be distinguished from the first solder mask 6). The conductor member 8 and the second solder mask 9 are disposed on an opposite surface of the carrier 1. The conductor member 8 includes a first pad 81, a second pad 82, and a third pad 83. The third pad 83 is arranged between the first pad 81 and the second pad 82. As shown in FIG. 2, the first pad 81 and second pad 82 are respectively and electrically connected to the first polarity portion 21 and the second polarity portion 22 via two conductive through holes V. However, the present disclosure is not limited thereto. For example, the first pad 81 and the second pad 82 can be respectively and electrically connected to the first polarity portion 21 and the second polarity portion 22 via two conductive posts. Or, the conductor member 8 can be a copper foil, and the second solder mask 9 can be made from a solder mask ink of a dark color or a white color. Further, surfaces of the first pad 81 and the second pad 82 also have a metal plated layer (e.g., electroless nickel plating/immersion gold), so as to provide good solderability. Furthermore, the second solder mask 9 covers the third pad 83. The third pad 83 is without electrical properties. The second solder mask 9 has a polarity identification assembly A disposed thereon and is provided for user identification. It is worth mentioning that a thickness of the second solder mask 9 is not greater than twice a thickness of the third pad 83, and is preferably one times. Such a structural feature is mainly designed for a subsequent soldering process. In addition, it should be noted that a difference between an area of the metal member 2 and a sum of areas of the first pad 81, the second pad 82, and the third pad 83 (i.e., the conductor member 8) is less than or equal to 10%. That is to say, the area of the metal member 2 is substantially equal to the sum of the areas of the first pad 81, the second pad 82, and the third pad 83, such that metal areas of the top and lower surfaces of the carrier 1 can be maintained to be approximately the same. Accordingly, through a stress release structure (e.g., the configuration of the third pad 83), a stress of the metal member 2 when being bonded with the carrier 1 can be effectively balanced in the present disclosure, so as to reduce warpage of the carrier 1 (which can cause the optoelectronic element 4 to break).

Second Embodiment

Figure 6:
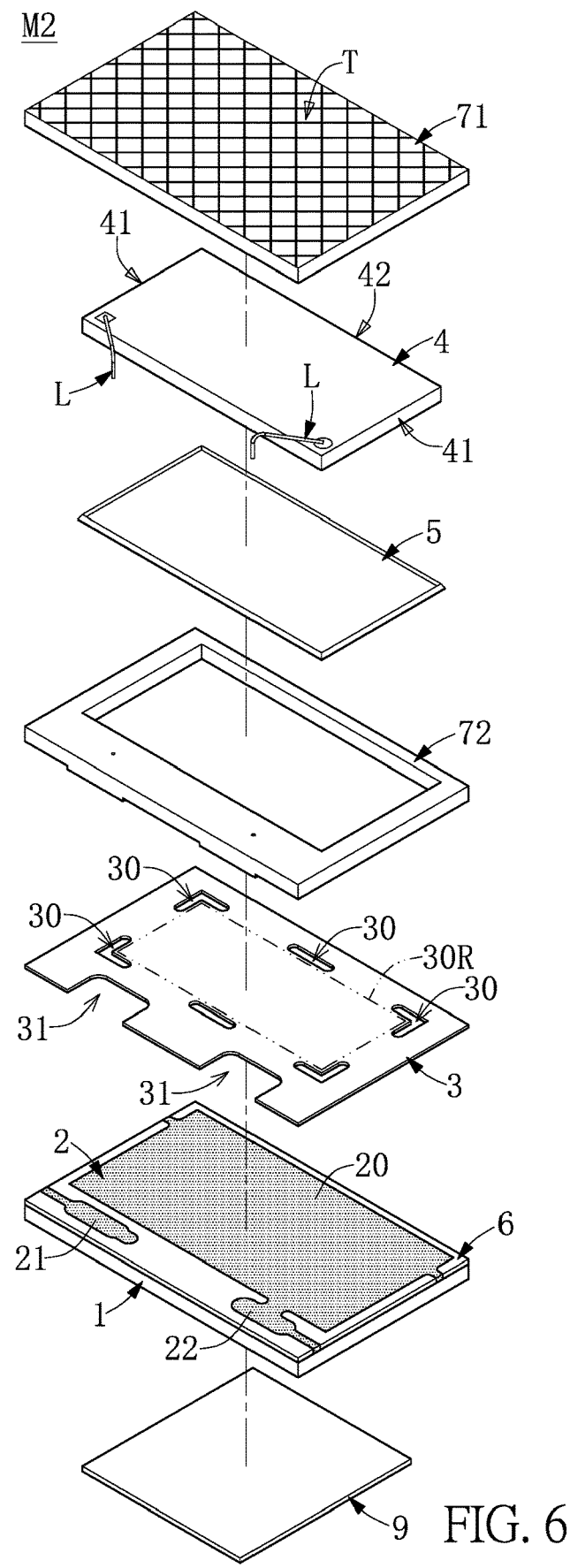
FIG. 6 is a schematic exploded view of an optoelectronic package structure according to a second embodiment of the present disclosure.

Reference is made to FIG. 6, which is a schematic exploded view of an optoelectronic package structure according to a second embodiment of the present disclosure. A comparison between FIG. 6 and FIG. 3 shows that an optoelectronic package structure M2 of the second embodiment has a structure similar to that of the optoelectronic package structure M of the first embodiment. The difference resides in that the optoelectronic package structure M2 further includes a second encapsulant 72. The second encapsulant 72 is disposed around a periphery of the optoelectronic element 4, and the two concave portions 31 are filled with the second encapsulant 72. Further, the first encapsulant 71 covers the optoelectronic element 4 and the second encapsulant 72. The second encapsulant 72 is an opaque adhesive (e.g., a black adhesive), but is not limited thereto. Moreover, through a surface treatment, a top surface T of the first encapsulant 71 is processed into a roughened surface. A roughness (Ra) of the roughened surface is between 1 μm and 3 μm. In the present disclosure, by configuring the top surface T of the first encapsulant 71 to be a roughened surface, the optoelectronic package structure M2 can be conveniently removed by a suction nozzle when a subsequent surface-mount technology (SMT) process is performed. That is, the top surface T that is configured to be a roughened surface has an anti-adhesion property against the suction nozzle.

Third Embodiment

Figure 7:
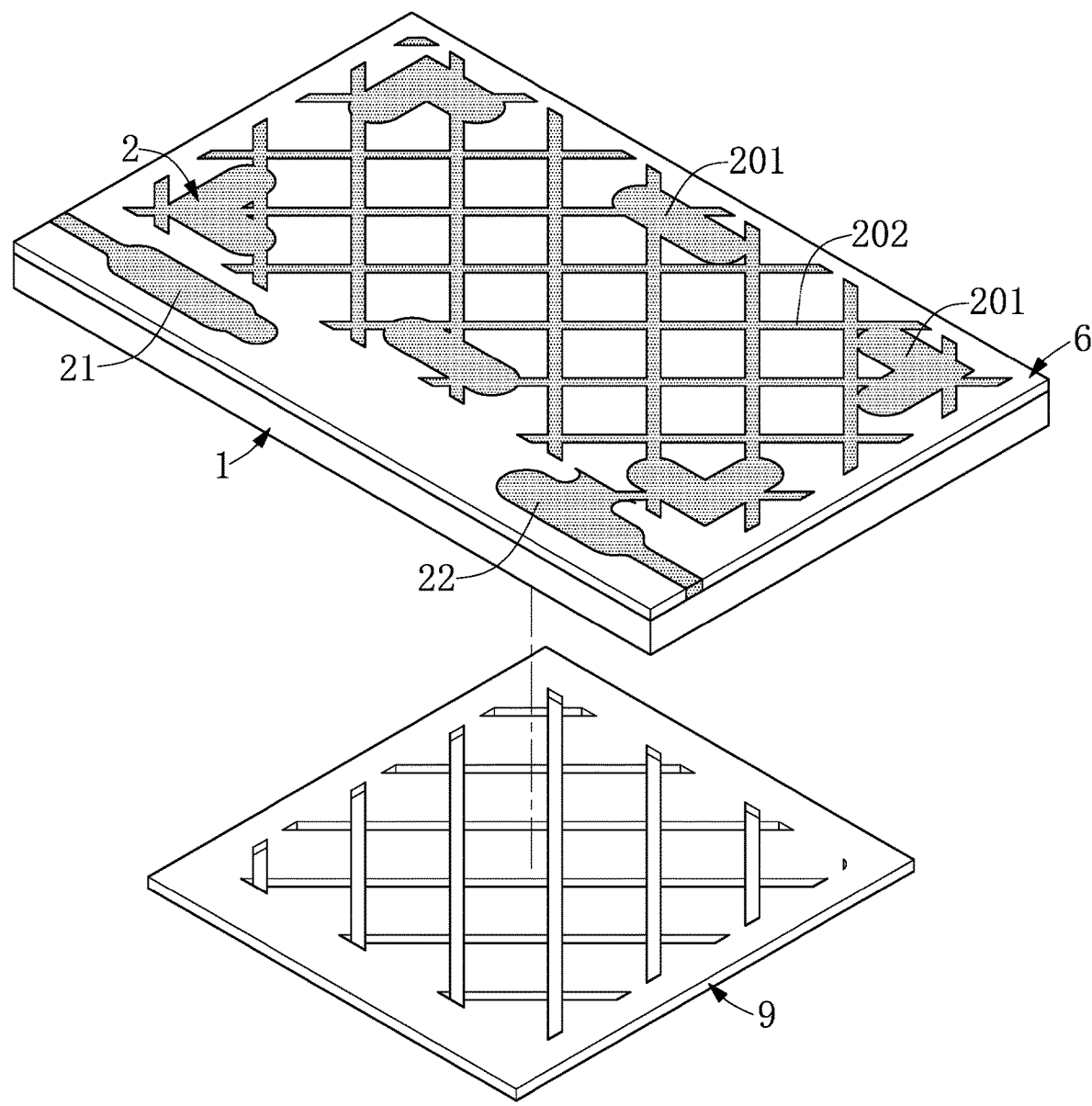
FIG. 7 to FIG. 8 are schematic perspective views showing a top surface and a bottom surface of a carrier of an optoelectronic package structure according to a third embodiment of the present disclosure.
Figure 8:
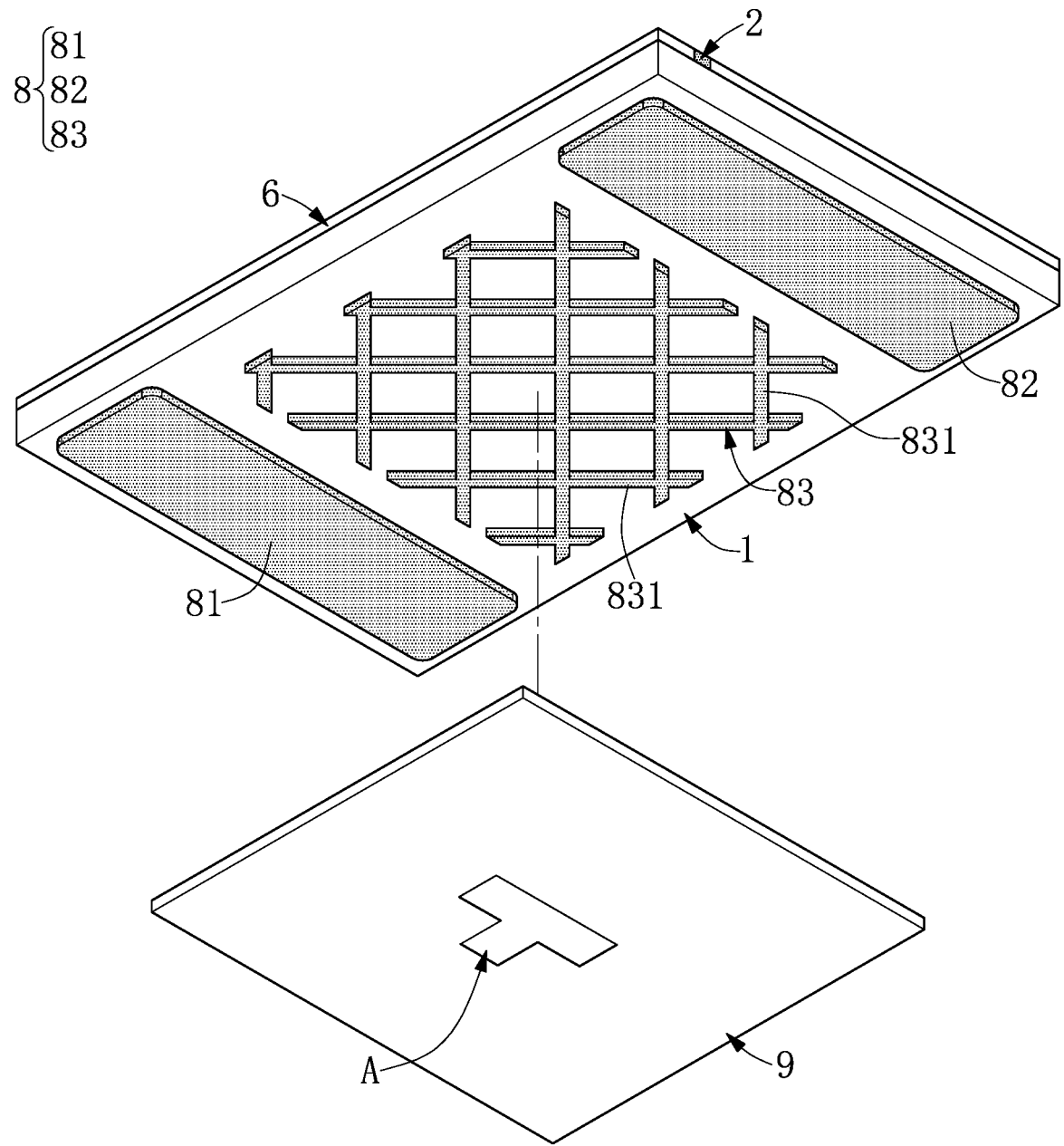

Referring to FIG. 7 and FIG. 8, the difference between an optoelectronic package structure of a third embodiment and that of the first embodiment resides in that, in this embodiment, the metal member 2 includes the main portion 20, the first polarity portion 21, and the second polarity portion 22, and the main portion 20 has a first grid region. The first grid region is formed by a plurality of protruding grid lines 202, and the grid lines 202 are configured to extend diagonally with respect to the edge of the carrier 1. A width of each of the grid lines 202 is between 0.1 mm and 0.2 mm, and a gap defined between two adjacent ones of the grid lines 202 that are parallel to each other is between 0.2 mm and 0.4 mm. Moreover, the first grid region includes pads 201 that correspond in shape to the grooves 30 of the insulating layer 3. When the insulating layer 3 is disposed on the metal member 2, the grooves 30 of the insulating layer 3 respectively correspond to the pads 201 in the first grid region. That is, orthogonal projections of the grooves 30 of the insulating layer 3 onto the main portion 20 overlap with the pads 201 in the first grid region. In the present embodiment, the conductor member 8 includes the first pad 81, the second pad 82, and the third pad 83, and the third pad 83 has a second grid region. The second grid region of the third pad 83 is formed by a plurality of protruding grid lines 831. Through the configuration of the second grid region of the third pad 83, a difference between an area of the metal member 2 and a sum of areas of the first pad 81, the second pad 82, and the third pad 83 can be maintained within a range of less than or equal to 10%.

In the optoelectronic package structure, the adhesive 5 needs to be baked and cured, so as to fix the optoelectronic element 4 onto the insulating layer 3. During a baking process, the heat causes shrinking and warping of the circuit substrate, thereby causing the optoelectronic element 4 to break (especially when a length-width ratio of the optoelectronic element 4 is greater than 2). Therefore, through the main portion 20 of the metal member 2 having a grid-like design, a heat stress endured by the circuit substrate can be effectively released in the present disclosure, so as to reduce the shrinking and warping of the circuit substrate (the carrier 1).

Figure 9:
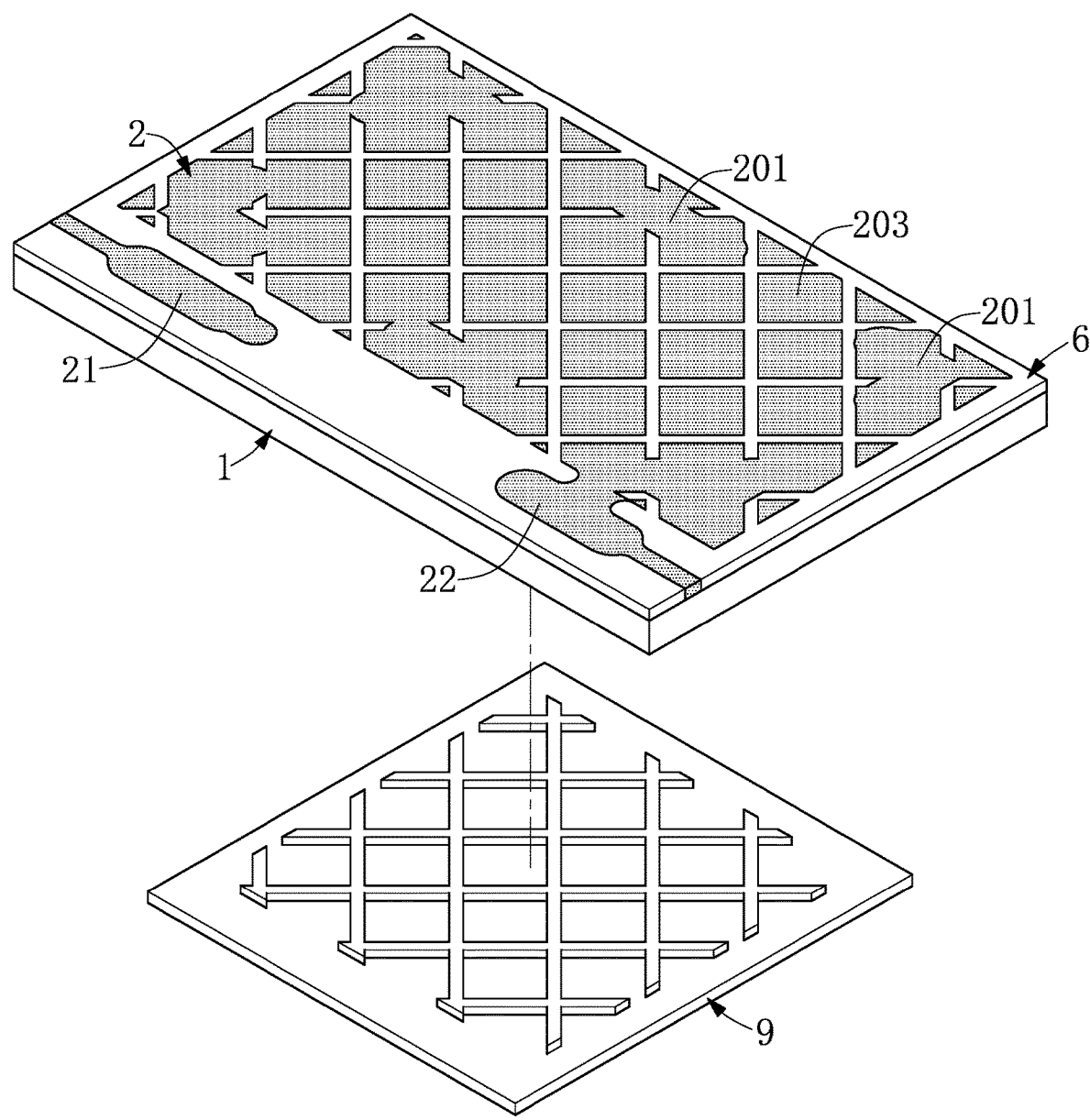
FIG. 9 to FIG. 10 are schematic perspective views showing the top surface and the bottom surface of the carrier of the optoelectronic package structure in another configuration according to the third embodiment of the present disclosure.
Figure 10:
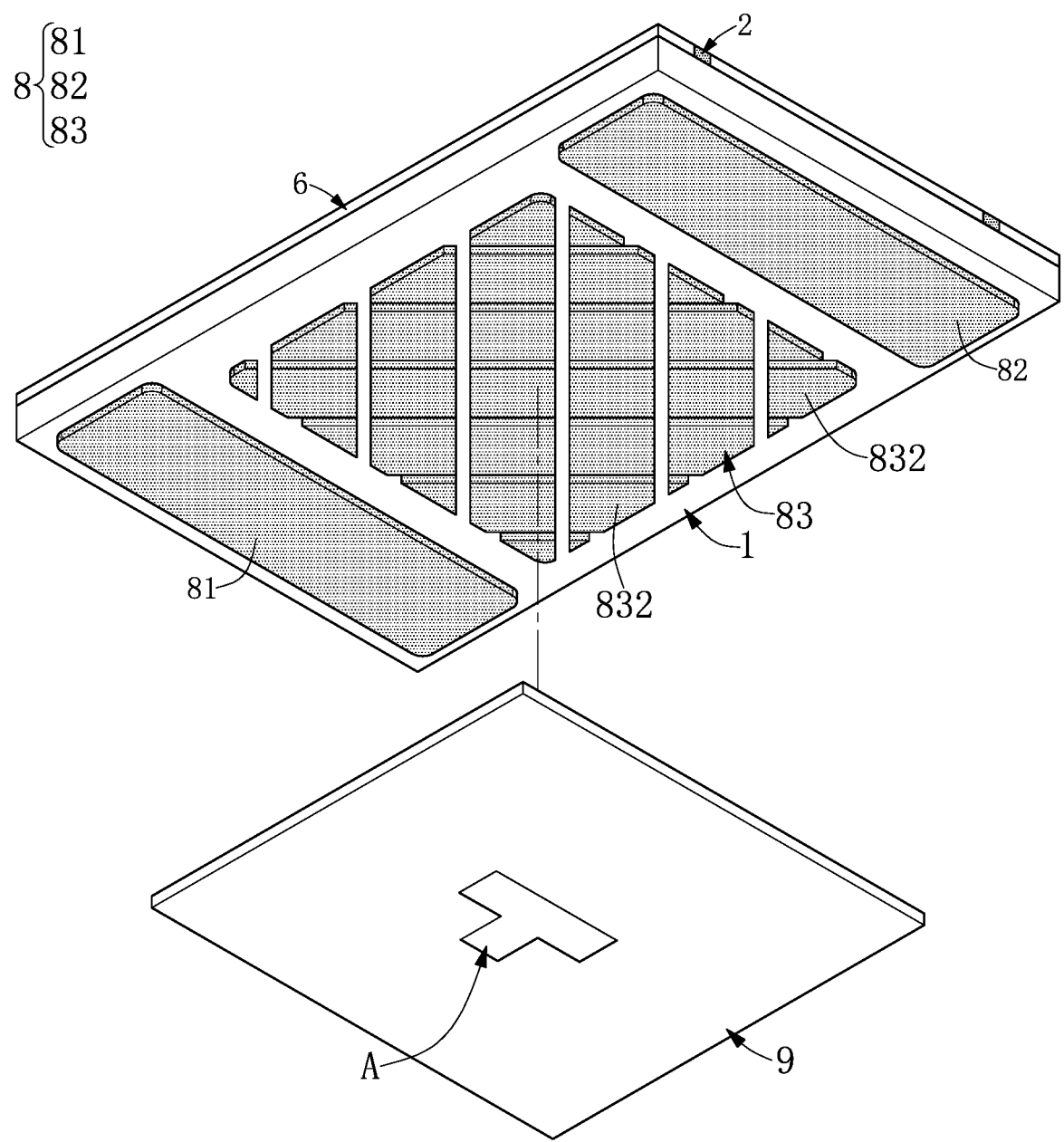

Reference is made to FIG. 9 and FIG. 10, which show another configuration of the third embodiment. When FIG. 9 and FIG. 10 are compared with FIG. 7 and FIG. 8, the difference therebetween resides in formation of the grid region. Specifically, in FIG. 9, the first grid region of the main portion 20 of the metal member 2 is formed by a plurality of protruding grids 203. That is, compared with the first grid region of the optoelectronic package structure in FIG. 7 and FIG. 8, the first grid region of the main portion 20 in the present embodiment is formed by the protruding grids 203. Gaps among the grids 203 are filled with the first solder mask 6, and are taken as being equivalent to grid lines. Further, these gaps (grid lines) are configured to extend in a diagonal direction. A width of the gap is between 0.1 mm and 0.2 mm, and each of the grids 203 has a width (i.e., a side length of the grid) of between 0.2 mm and 0.4 mm.

Further, in FIG. 10, the third pad 83 also has the second grid region, and the second grid region of the third pad 83 is formed by a plurality of protruding grids 832. Gaps among the grids 832 are equivalent to grid lines, and these grid lines (gaps) are configured to extend in a diagonal direction. Through the configuration of the second grid region of the third pad 83, a difference between an area of the metal member 2 and a sum of areas of the first pad 81, the second pad 82, and the third pad 83 can be maintained within a range of less than or equal to 10%.

Fourth Embodiment

Figure 11:
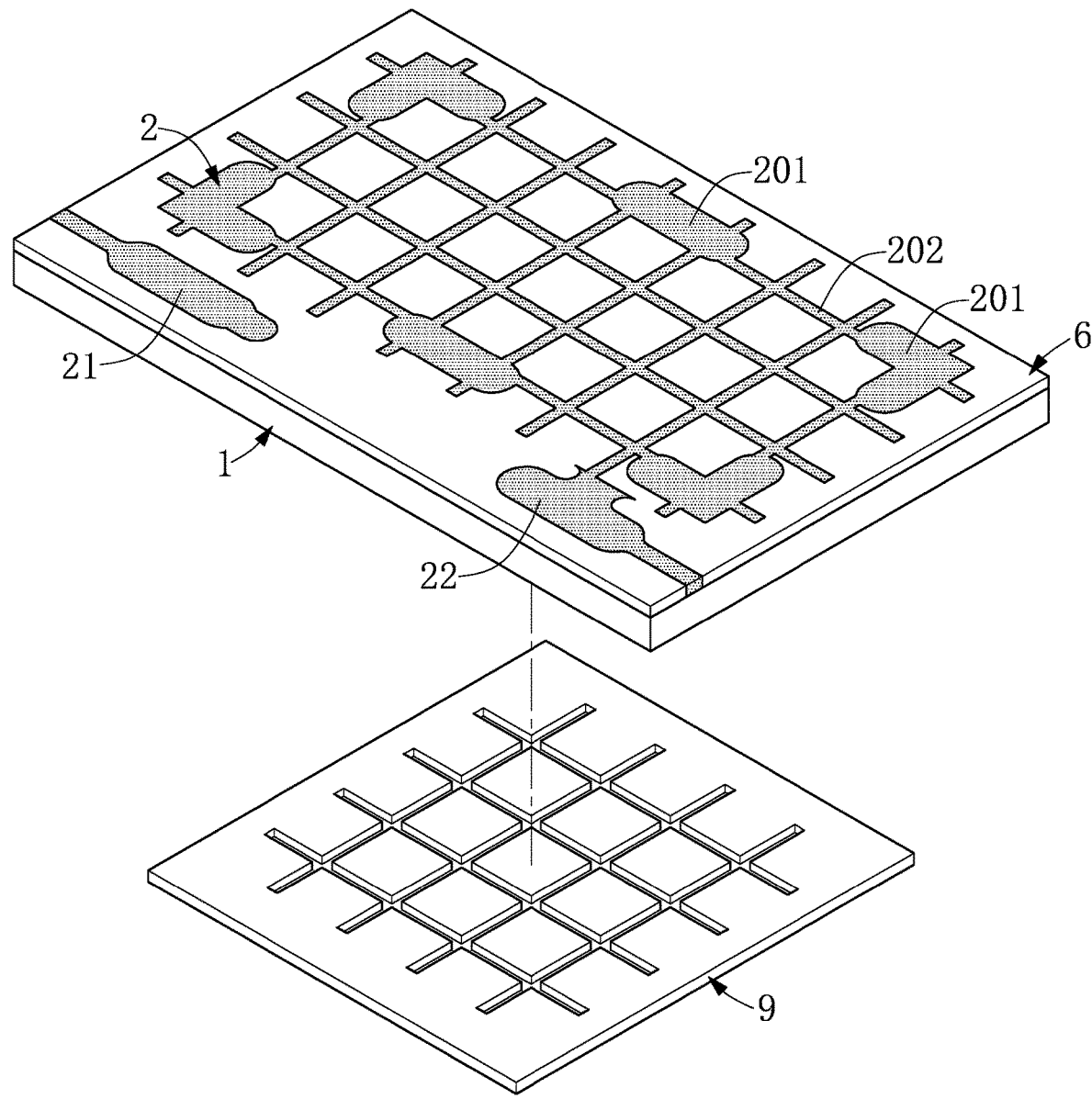
FIG. 11 to FIG. 12 are schematic perspective views showing a top surface and a bottom surface of a carrier of an optoelectronic package structure according to a fourth embodiment of the present disclosure.
Figure 12:
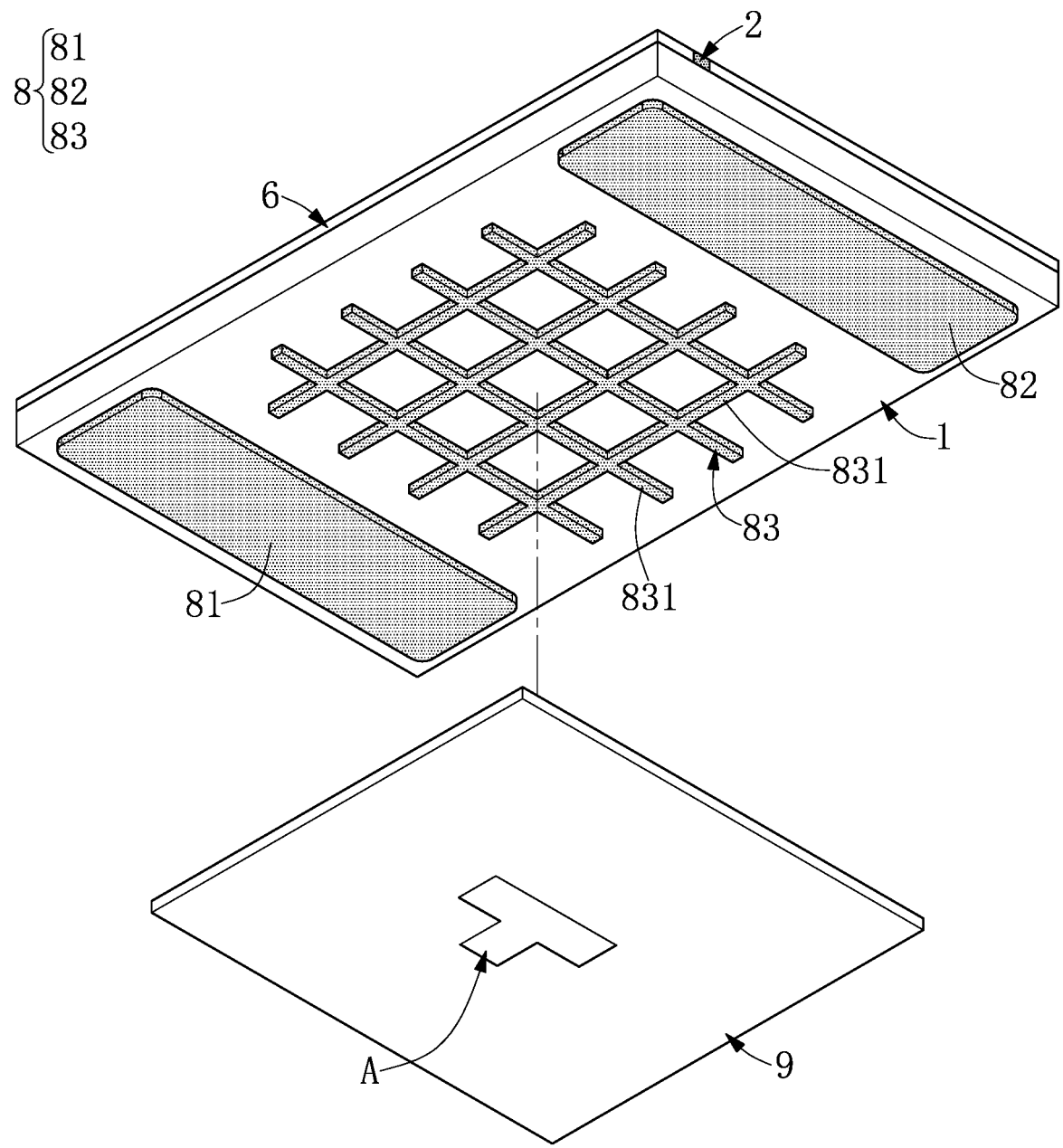

Reference is made to FIG. 11 and FIG. 12. In an optoelectronic package structure of a fourth embodiment, the first grid region of the main portion 20 is formed by the protruding grid lines 202, and an included angle of 90 degrees is defined between each of the grid lines 202 and a border line (not shown in the drawings) that extends along one edge of the carrier 1. That is to say, the grid lines 202 extend parallel or perpendicular to the edges of the carrier 1.

The first grid region of the main portion 20 includes the pads 201 that correspond in shape to the grooves 30 of the insulating layer 3. This is the same as in the third embodiment. When the insulating layer 3 is disposed on the metal member 2, the grooves 30 of the insulating layer 3 respectively correspond to the pads 201 in the first grid region. That is, the orthogonal projections of the grooves 30 of the insulating layer 3 onto the main portion 20 overlap with the pads 201 in the first grid region. In addition, the third pad 83 also has the second grid region. The second grid region of the third pad 83 is formed by the protruding grid lines 831, and an included angle of 90 degrees is defined between each of the grid lines 831 and a border line (not shown in the drawings) that extends along one edge of the carrier 1. That is to say, the grid lines 831 extend parallel or perpendicular to the edges of the carrier 1. Through the configuration of the second grid region of the third pad 83, a difference between an area of the metal member 2 and a sum of areas of the first pad 81, the second pad 82, and the third pad 83 can be maintained within a range of less than or equal to 10%.

Figure 13:
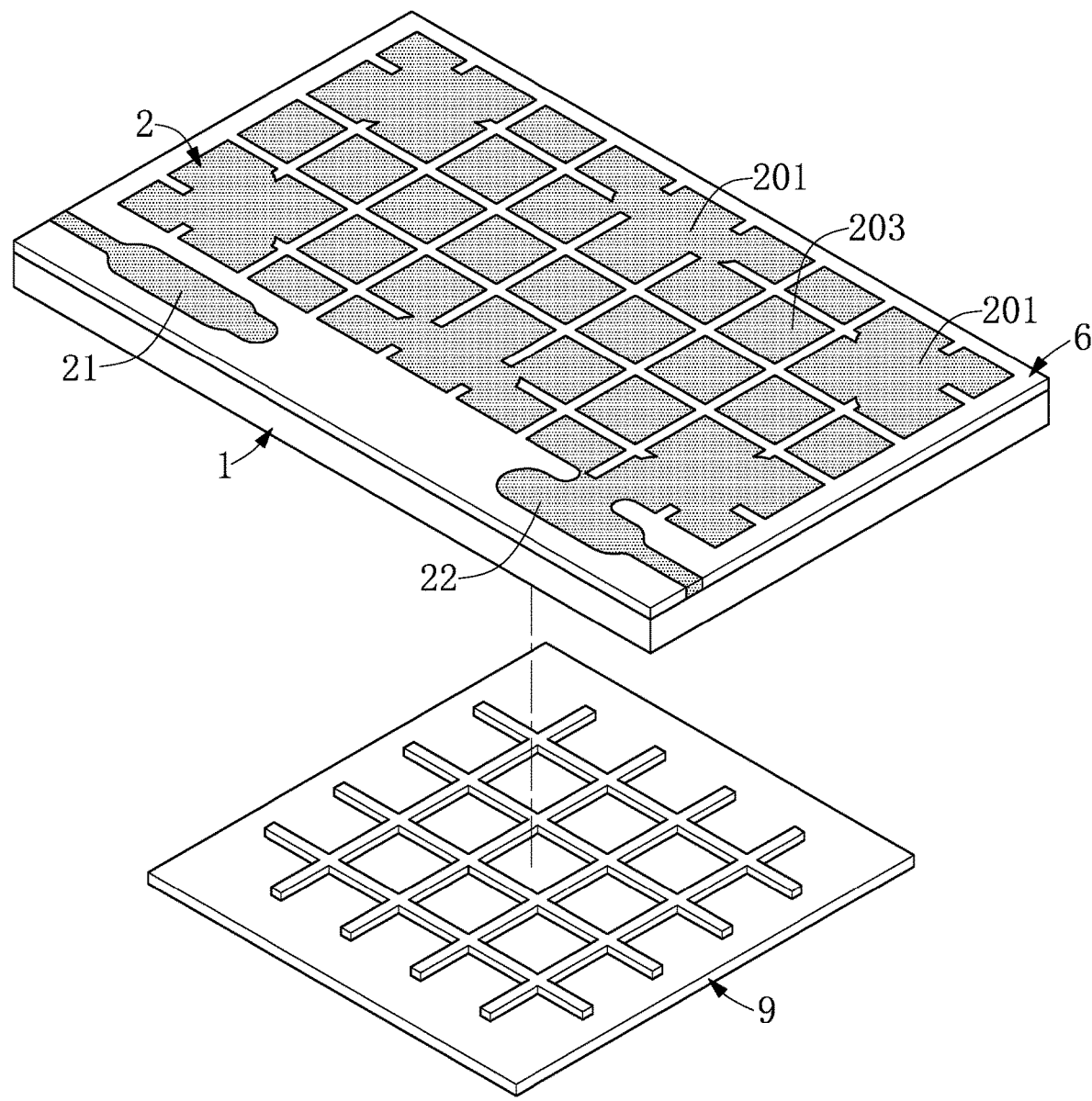
FIG. 13 to FIG. 14 are schematic perspective views showing the top surface and the bottom surface of the carrier of the optoelectronic package structure in another configuration according to the fourth embodiment of the present disclosure.
Figure 14:
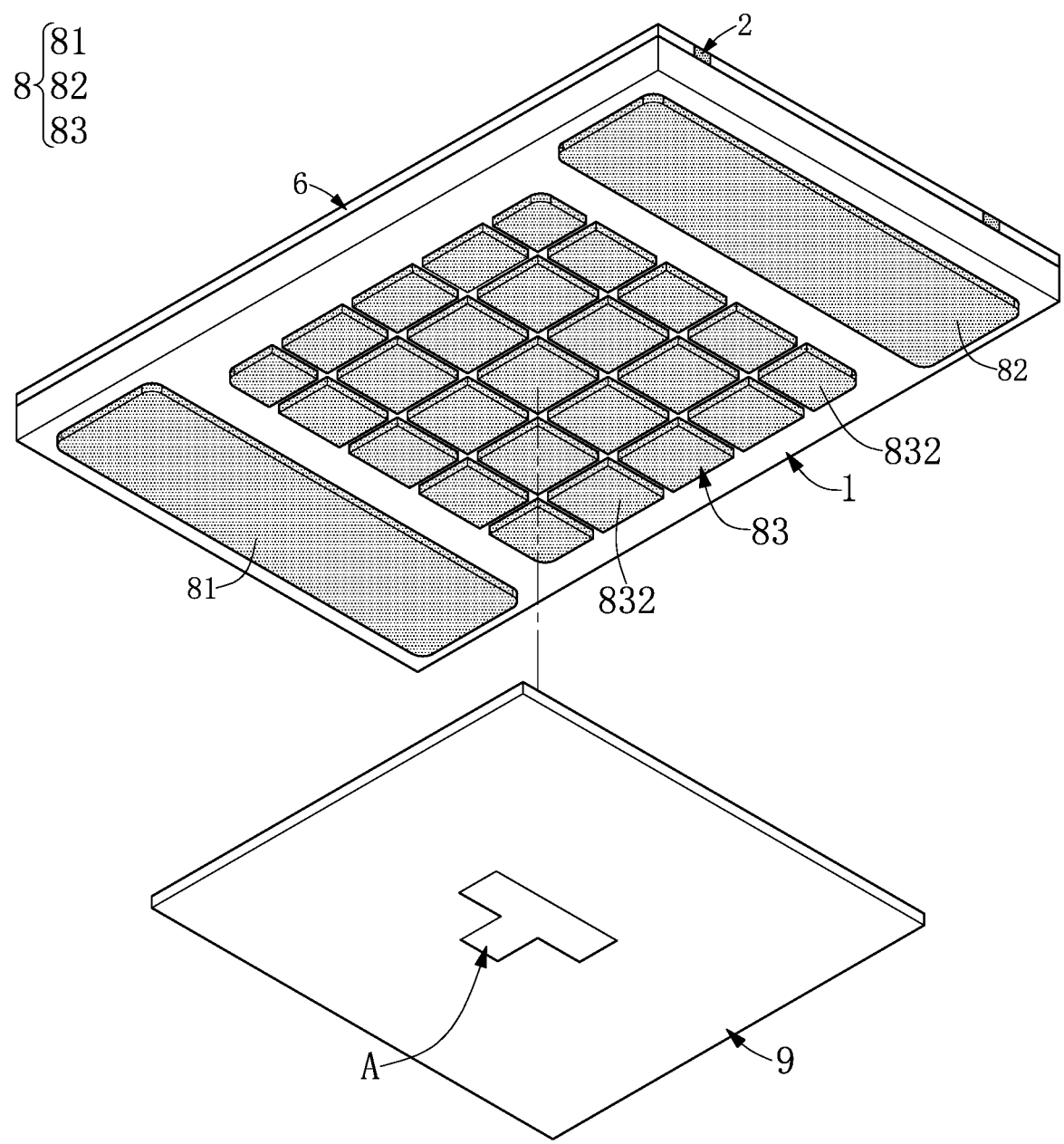

Reference is made to FIG. 13 and FIG. 14, which show another configuration of the fourth embodiment. When FIG. 13 and FIG. 14 are compared with FIG. 11 and FIG. 12, the difference therebetween resides in that the main portion 20 of the metal member 2 has the first grid region that is formed by the protruding grids 203. The gaps among the grids 203 are equivalent to the grid lines of the first grid region, and these gaps (grid lines) extend parallel or perpendicular to the edges of the carrier 1. Further, the third pad 83 also has the second grid region that is formed by the protruding grids 832. The gaps among the grids 832 are equivalent to the grid lines of the second gird region, and these grid lines (gaps) extend parallel or perpendicular to the edges of the carrier 1. Through the configuration of the second grid region of the third pad 83, a difference between an area of the metal member 2 and a sum of areas of the first pad 81, the second pad 82, and the third pad 83 can be maintained within a range of less than or equal to 10%.

Beneficial Effects of the Embodiments

In conclusion, in the optoelectronic package structure provided by the present disclosure, the insulating layer 3 is disposed on the metal member 2, the insulating layer 3 has the plurality of grooves 30, and the carrying region 30R that is configured to accommodate the optoelectronic element 4 is defined by the grooves 30. In the conventional technology, since the optoelectronic element 4 is usually directly disposed on the carrier 1, an area of a region for accommodating the optoelectronic element 4 on the carrier 1 is limited by an area of a wire bonding region, thereby causing a size of the optoelectronic element 4 to be limited as well. In the present disclosure, by using the insulating layer 3 for accommodation of the optoelectronic element 4, the optoelectronic element 4 can be disposed on the carrying region 30R without being limited by the area of the wire bonding region. Accordingly, the size of the optoelectronic diode and an area of a light-receiving surface can be increased, such that a photoelectric current outputted by the optoelectronic element 4 can be increased, and an improved detection accuracy can be provided.

More specifically, in the optoelectronic package structure M provided by the present disclosure, the first distance H1 (as shown in FIG. 1) is defined between each of the first sides 41 of the optoelectronic element 4 and the corresponding edge of the carrier 1, and the second distance H2 (as shown in FIG. 2) is defined between the second side 42 of the optoelectronic element 4 and the corresponding edge of the carrier 1. The first distance H1 and the second distance H2 are 200 µm or less. Moreover, the ratio of the projection area of the carrying region 30R to that of the orthogonal projection of the optoelectronic element 4 onto the carrier 1 is from 0.7 to 0.9. Accordingly, in the optoelectronic package structure M of the present disclosure, an area percentage of the optoelectronic element 4 that is disposed on the carrier 1 can be maximized and a maximum package effect can be achieved, such that the optoelectronic package structure M can have an enhanced photoelectric current output and an improved detection accuracy.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optoelectronic package structure, comprising:
   a carrier;
   a first pad, a second pad, and a third pad, wherein the first pad, the second pad, and the third pad are disposed at a bottom surface of the carrier, and the third pad is arranged between the first pad and the second pad;
   a metal member disposed on the carrier;
   an insulating layer disposed on the metal member, wherein the insulating layer has a plurality of grooves, and a carrying region is defined by the grooves;
   an optoelectronic element disposed on the insulating layer; and
   an adhesive filled into the grooves and bonding the optoelectronic element onto the carrying region of the insulating layer.

2. The optoelectronic package structure according to claim 1, further comprising a first solder mask disposed on the carrier, wherein a top surface of the first solder mask is flush with a top surface of the metal member.

3. The optoelectronic package structure according to claim 1, further comprising a first encapsulant disposed on the carrier, wherein the first encapsulant covers the optoelectronic element.

4. The optoelectronic package structure according to claim 3, wherein a roughness of a top surface of the first encapsulant is between 1 µm and 3 µm.

5. The optoelectronic package structure according to claim 3, further comprising a second encapsulant disposed around a periphery of the optoelectronic element, wherein the first encapsulant covers the optoelectronic element and the second encapsulant.

6. The optoelectronic package structure according to claim 2, wherein the first solder mask and the insulating layer are selectively a dark color ink or a white color ink.

7. The optoelectronic package structure according to claim 1, wherein a difference between an area of the metal member and a sum of areas of the first pad, the second pad, and the third pad is less than or equal to 10%.

8. The optoelectronic package structure according to claim 2, further comprising a second solder mask covering the third pad, wherein a maximum thickness of the second solder mask is not greater than twice a thickness of the third pad.

9. The optoelectronic package structure according to claim 1, wherein a ratio of a projection area of the carrying region to a projection area of an orthogonal projection of the optoelectronic element onto the carrier is from 0.7 to 0.9.

10. The optoelectronic package structure according to claim 1, wherein the optoelectronic element has two first sides that are opposite to each other and a second side that is connected between the two first sides; wherein a first distance between each of the first sides and a corresponding edge of the carrier and a second distance between the second side and a corresponding edge of the carrier are 200 µm or less.

11. The optoelectronic package structure according to claim 1, wherein each of the grooves is L-shaped or shaped as a straight line.

12. The optoelectronic package structure according to claim 1, wherein the metal member includes a main portion, the main portion is disposed directly below the carrying region, the main portion has a first grid region, and orthogonal projections of the grooves of the insulating layer onto the main portion overlap with a plurality of pads in the first grid region.

13. The optoelectronic package structure according to claim 12, wherein the third pad has a second grid region, and the first grid region and the second grid region each have a plurality of grid lines or a plurality of grids.

14. The optoelectronic package structure according to claim 13, wherein an included angle of 90 degrees is defined between a border line that extends along one edge of the carrier and each of the grid lines in the first grid region and the second grid region.

15. The optoelectronic package structure according to claim 1, wherein the metal member further includes a first polarity portion and a second polarity portion, the insulating layer further has two concave portions, and the first polarity portion and the second polarity portion are respectively exposed from the two concave portions; wherein the optoelectronic element is correspondingly and electrically connected to the first polarity portion and the second polarity portion.

16. An optoelectronic package structure, comprising:
    a carrier;
    a metal member formed on the carrier;
    an insulating layer covering the metal member, wherein the insulating layer has a plurality of grooves;
    an optoelectronic element disposed on the insulating layer and bonding with a part of the metal member exposed from the grooves; and
    an encapsulant disposed on the carrier and covering the optoelectronic element;
    wherein at least two distances between at least two sides of the optoelectronic element and corresponding edges of the encapsulant are 200 µm or less.

17. The optoelectronic package structure according to claim 16, further comprising a first pad, a second pad, and a third pad that is arranged between the first pad and the second pad, wherein the first pad, the second pad, and the third pad are disposed at a bottom surface of the carrier;

wherein a difference between an area of the metal member and a sum of areas of the first pad, the second pad, and the third pad is less than or equal to 10%.

18. The optoelectronic package structure according to claim 16, wherein the optoelectronic element has a plurality of first sides and a second side neighboring the first sides; wherein a distance between the second side and a corresponding edge of the encapsulant is 125 µm or less.

19. The optoelectronic package structure according to claim 18, wherein a horizontal difference between one of the second sides of the optoelectronic element and one neighboring side of the metal member is between 75 µm and 125 µm.

* * * * *